United States Patent [19]

Swerling et al.

[11] 4,192,451
[45] Mar. 11, 1980

[54] DIGITAL DIAGNOSTIC SYSTEM EMPLOYING SIGNATURE ANALYSIS

[75] Inventors: Stephen Swerling; Steven R. Smith, both of Portland; Thomas W. Wiesmann, Beaverton, all of Oreg.

[73] Assignee: Tektronix, Inc., Beaverton, Oreg.

[21] Appl. No.: 910,172

[22] Filed: May 30, 1978

[51] Int. Cl.² .................... G06F 11/04; G01R 31/00
[52] U.S. Cl. .................................. 371/20; 324/73 R
[58] Field of Search ............... 235/302, 302.1, 304.1; 324/73 R, 73 AT

[56] References Cited

U.S. PATENT DOCUMENTS

| | | | |
|---|---|---|---|
| 3,764,995 | 10/1973 | Helf, Jr. et al. | 324/73 R |
| 3,813,647 | 5/1974 | Loo | 235/302 X |
| 3,916,306 | 10/1975 | Patti | 324/73 R |
| 4,012,625 | 3/1977 | Bowen et al. | 235/302 |

Primary Examiner—Jerry Smith
Attorney, Agent, or Firm—George T. Noe

[57] ABSTRACT

A digital diagnostic system employs signature analysis for locating faults at the system, module, or circuit component level in electronic equipment. Predetermined correct signatures and diagnostic decision tree information for a particular device under test are stored in system memory. The diagnostic system exercises the device under test to generate signatures which are obtained at various predetermined test points and electronically compared with a stored signature. From the diagnostic decision tree information, a troubleshooting sequence is automatically established which leads directly to a faulty module or component. In-circuit microprocessor emulation may be utilized to generate one or more of the signature signals.

6 Claims, 5 Drawing Figures

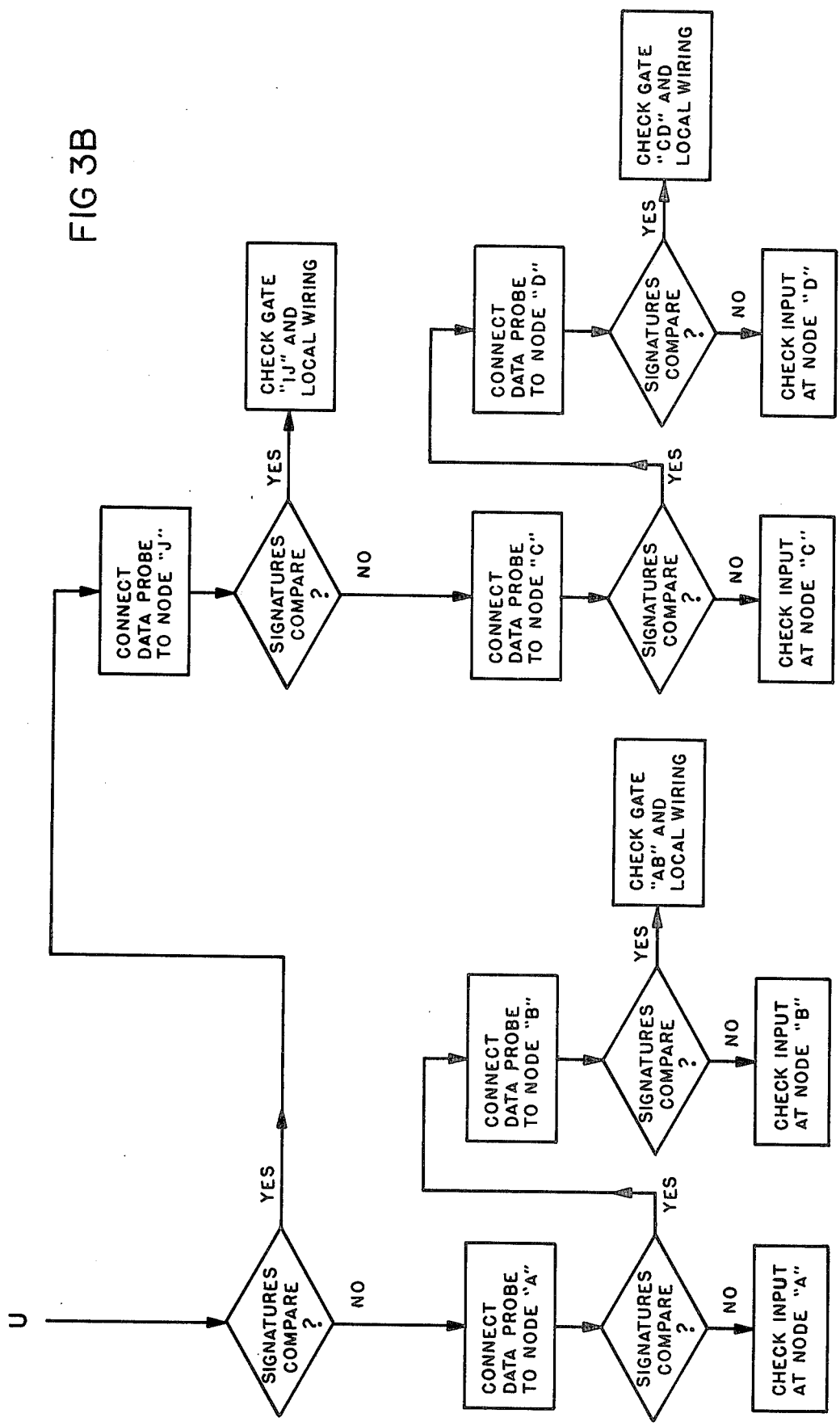

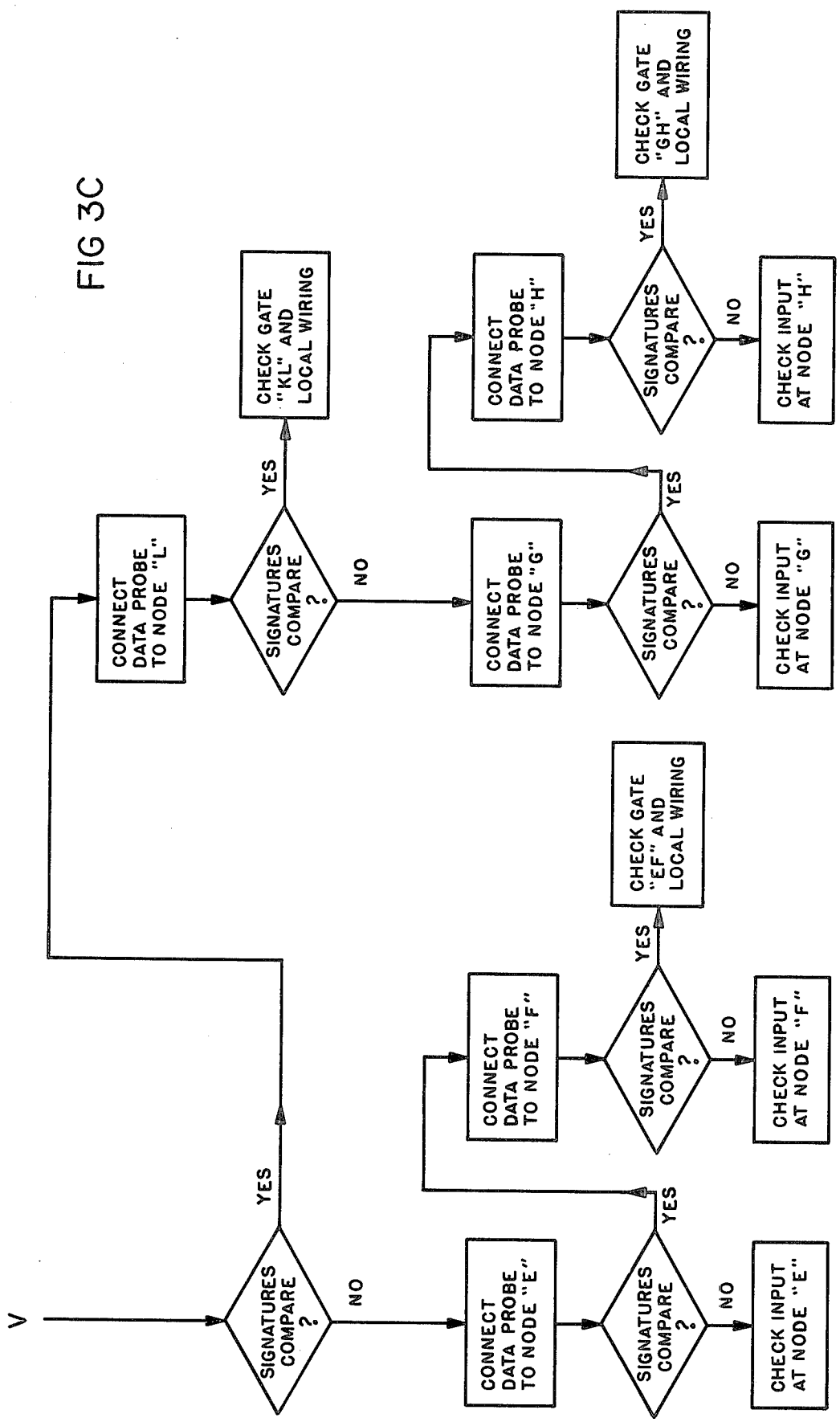

DIGITAL DIAGNOSTIC SYSTEM EMPLOYING SIGNATURE ANALYSIS

BACKGROUND OF THE INVENTION

The need to test and troubleshoot digital electronic circuits and equipment has precipitated a need for diagnostic apparatus which is capable of quickly locating faults or malfunctions, and which apparatus is also easy to use by service men or technicians. Currently available instruments such as oscilloscopes, logic probes, and logic state analyzers are presently used in diagnostic applications; however, the information provided by these instruments is limited or incomplete and subject to interpretation.

U.S. Pat. No. 3,573,751 describes a system for isolating faulty circuit modules in electronic equipment by the use of binary signature waveforms. A test sequence is provided whereby each module is energized to generate a signature waveform which is analyzed to determine its own particular class identifier. This analyzed class identifier is then compared with a stored class identifier of the correct signature waveform and as long as the signature class identifier signals match, the test sequence is advanced to the next module. Upon a mismatch of class identifier signals, the test sequence stops and a display indicator indicates the faulty module. Such a system is limited to locating a faulty module in a serial string of modules which may be addressed and tested in a sequence. In addition, the foregoing system employs a cumbersome system of signature analysis wherein binary waveforms are partitioned into a selected number of classes by summing, modulo N, binary numbers during a given interval to provide a quantitative value representing the class identification number. However, this summation approach to partitioning provides a one in N chance of a failed module going undetected because such a failed module will generate any signature class identifier with equal probability. Thus, for fast and accurate troubleshooting purposes, this system does not have sufficient reliability. Additionally, the foregoing system does not lend itself to isolating faults at the component level because the system does not provide for testing branched circuit paths.

A more accurate and less cumbersome method of signature analysis is described in U.S. Pat. No. 3,976,864. Here, serial bit streams are converted into hexadecimal signatures by means of a feedback shift register. The method employed by this patent in locating faulty components or modules is to apply a reference digital signal to a digital electronic circuit, touch a probe tip to a predetermined test point in the circuit, and observe the signature displayed by the test apparatus. This signature is mentally compared to a signature provided on the schematic of the circuit under test. However, even for a skilled technician or one having intimate knowledge of the circuit under test, such an approach is tedious, time consuming, and prone to error, particularly where troubleshooting a complex circuit.

SUMMARY OF THE INVENTION

In accordance with the present invention, a digital diagnostic system employing signature analysis is provided for locating faults at the system, module, or circuit component level in digital electronic equipment. Predetermined correct signatures and diagnostic decision tree information for a particular device to be tested by signature analysis are loaded into system memory from a magnetic tape or the like. A data probe is connected from the system apparatus to a circuit node which is designated as a test point by the diagnostic tree information and the device is energized. Clock signals and start and stop signals may also be applied from the device to the system apparatus via probe connections, or one or more of these signals may be generated by incircuit microprocessor emulation. From these signals a cyclic redundancy check character value, or signature, for the serial binary data stream at the test point is generated. The signature thus generated is compared with a predetermined good signature stored in system memory. A display device is provided to tell the technician whether the component associated with the test point is good or bad, and which test point to check next. Thus from the diagnostic decision tree information, a troubleshooting sequence is automatically established to lead a technician or serviceman directly to a faulty module or component.

It is therefore one object of the present invention to provide a digital diagnostic system employing signature analysis for locating faults at the component level.

It is another object to provide an automatic digital diagnostic system including in-circuit emulation of a target processor.

It is a further object to provide a digital diagnostic system which operates under program control to substantially reduce troubleshooting time.

It is an additional object to provide a digital diagnostic system the use of which does not require a highly trained or skilled technician.

Other objects and attainments of the present invention will become apparent to those skilled in the art upon a reading of the following detailed description when taken in conjunction with the drawings.

DRAWINGS

Figure 2:
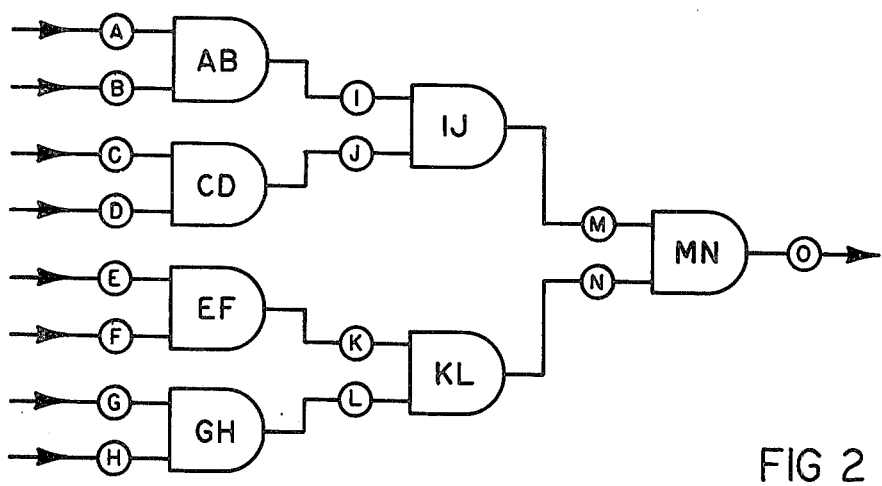
FIG. 2 shows a simplified digital circuit to be tested.
Figure 3A:
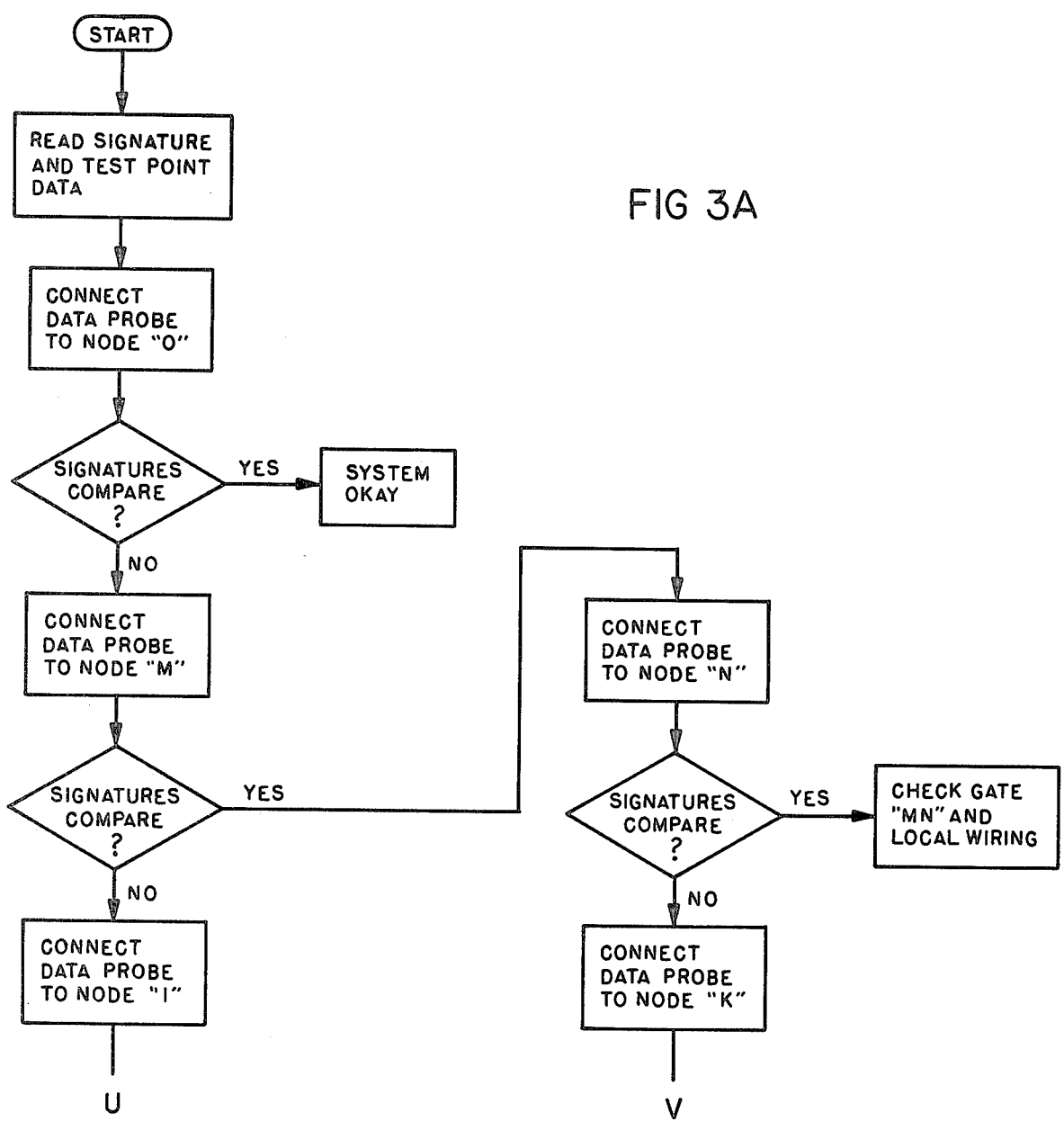

FIG. 3 comprising FIGS. 3A-3C shows a flow chart of a diagnostic decision tree program for use in troubleshooting the circuit of FIG. 2.

DETAILED DESCRIPTION OF THE DRAWINGS

Figure 1:
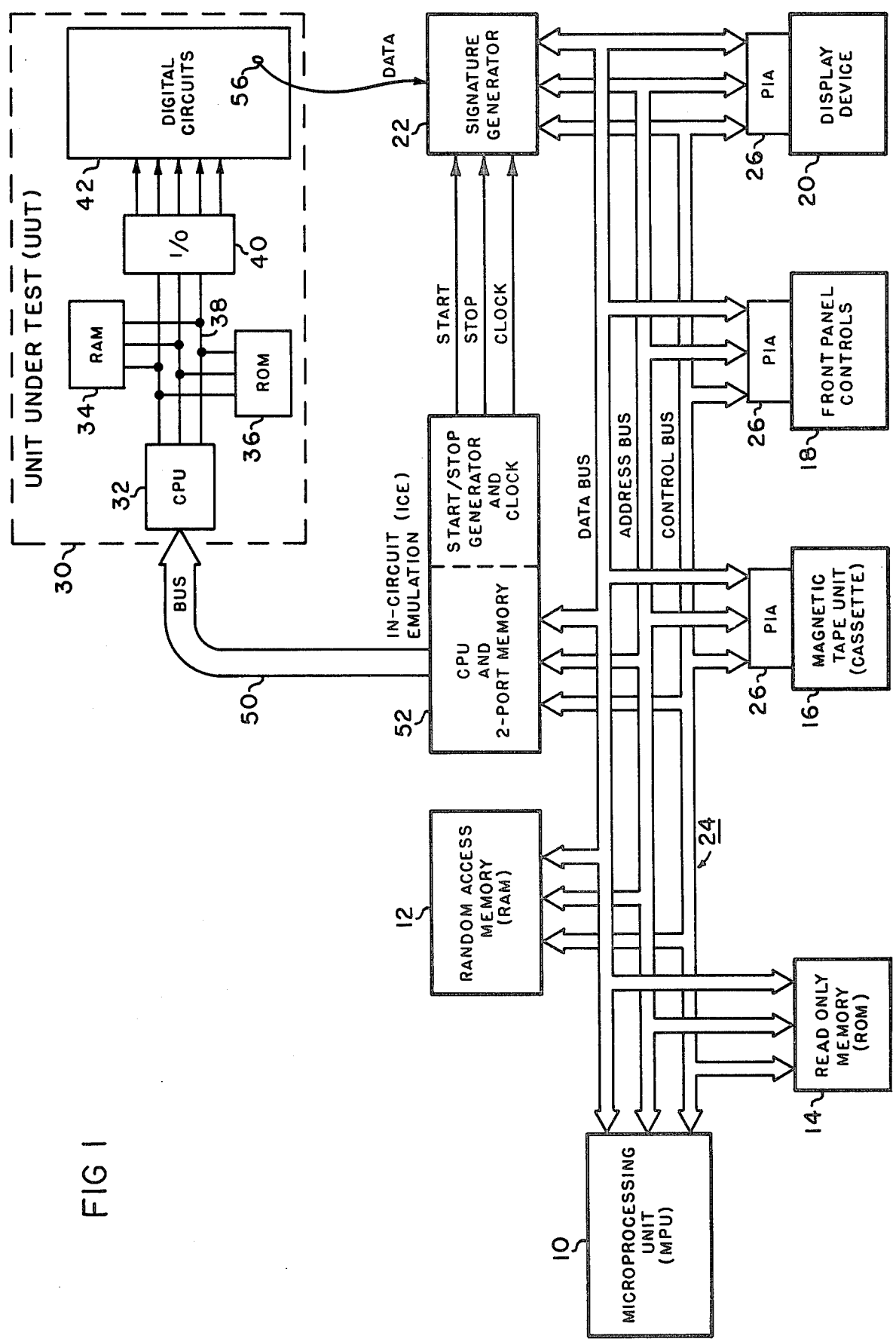
FIG. 1 is a block diagram of a digital diagnostic system in accordance with the present invention.

Referring now to FIG. 1, there is shown a block diagram of the digital diagnostic system. The primary components of the system include a microprocessing unit (MPU) 10, a random access memory (RAM) 12, a read-only memory (ROM) 14, a magnetic tape unit 16, a front panel control unit 18, a display device 20, and a signature generator 22. These units are interconnected by a bus 24, which includes data bus, address bus, and control bus lines to provide interactive communication between the various units.

The MPU 10, RAM 12, ROM 14, and bus 24 are system compatible, and suitably may be commercially available in family form from a number of semiconductor houses. Examples of such families of integrated circuit microprocessing systems include Motorola 6800, Intel 8080, and Zilog Z-80. The magnetic tape unit 16, front panel control unit 18, and display device are connected to the bus 24 by Peripheral Interface Adapters (PIA) 26, which are commercially available input/output interface devices and compatible with the Motorola 6800 microprocessing system that is utilized.

The MPU 10 is the main controller for the system, and as such, directs system operations in accordance with program instructions. Additionally, the MPU decodes such program instructions, and performs arithmetic and logic operations as well. Permanent program instructions are stored in ROM 14, while temporary program instructions are input to the system via peripheral devices, such as the magnetic tape unit 16 and front panel control unit 18, and temporarily stored in RAM 12. RAM 12 is primarily a read/write device and additionally provides storage for intermediate processing results. The interface unit 26 each contain registers which to the MPU appear to be memory locations. Each such register has its own address within the address space of the MPU, and is addressed by the MPU in the same manner as a memory location is addressed.

The magnetic tape unit 16 provides a means of providing specific program instructions to the system, and perhaps for making a permanent record of information stored in the RAM 12. The specific program instructions mentioned may suitably be a troubleshooting program for a specific device to be tested, and for convenience may be stored in a tape cassette or cartridge. For this arrangement, the magnetic tape unit 16 suitably includes a tape drive module, tape logic circuitry, timers, interrupt control, and so forth. It should be mentioned that a tape unit is not the only way to input progam information, but is more convenient than card readers or keyboards, for example. With a tape cassette, program software in paper form does not have to be provided to a technican using the system. Further, a tape cassette is durable and easy to store between uses, and is capable of containing all the pre-recorded information for a given unit to be tested. It should be noted that in addition to canned programs, a technician could write and implement his own test programs.

The front panel control unit 18 includes various switches and controls to allow a user to set up a particular test mode. Internal registers are provided to store information relating to the various switch positions, and the MPU can quickly access this information.

Display device 20 suitably may be a conventional cathode-ray tube oscilloscope or X–Y monitor containing digital-to-analog converters, character generators, vertical and horizontal amplifiers, and a cathode-ray tube having a viewing screen.

The signature generator 22 is basically a conventional feedback shift register that operates on digital data in accordance with synchronous start, stop, and clock signals to provide a cyclic redundancy check character, or signature.

A unit under test (UUT) 30 may be any device containing digital electronic circuits in which it is desired to diagnose faults. The minimum requirements are that the UUT provide the necessary data, start, stop, and check signals to operate the signature generator 22. For this purpose, the signature generator 22 suitably may include four data probes for connection to appropriate points within the UUT to collect these signals. However, as the block diagram shows, the UUT in this example is a sophisticated system including a central processing unit (CPU) 32, a RAM 34, a ROM 36, a bus 38, an input-output interface (I/O) 40, and the above-mentioned digital circuits 42. For example, this system may be a point-of-sale terminal cash register.

The reason that UUT 30 was chosen to be a fairly sophisticated device in this example is that in-circuit emulation is completely compatible with the diagnostic system of the present invention, and provides complete automatic control over the UUT. In-circuit emulation is a fairly new concept which allows one processing system to emulate the processor in another system. The processor to be emulated is known as the target processor, which in this case is CPU 32. CPU 32 is removed from its socket and replaced by a bus 50, which is attached to an in-circuit emulation module 52. The in-circuit emulation module 52 is connected directly to the system bus 24, and includes as its basic architecture a control section (CPU) and two-port memory, a start-stop generator, and a clock. Without disturbing programs that may be stored in the UUT, the in-circuit emulation module 52 may provide program stimulation in the form of predetermined bit patterns to exercise the digital circuits 42.

An added advantage of the use of in-circuit emulation, where it is permissible to use such, is that all of the signals required to generate the signatures may be synchronously produced by the emulator, or ICE module 52. Thus the start, stop, and clock signals may be connected through internal wiring directly to the signature generator 22, so that those connections do not have to be made with the probes supplied with the signature generator. The only connections that have to be made are plugging the bus 50 into the target processor socket and connecting a data probe 56 to the appropriate node within the digital circuits 52 of the UUT 30. Once the troubleshooting sequence begins, only the data probe 56 needs to be moved or reconnected.

The in-circuit emulator may be utilized to test for faults within the target processor structure as well as testing within the digital circuits. For example, the data probe 56 may be connected to any of the lines within the bus 38 to verify operation of RAM 34, or ROM 36.

Operation of the diagnostic system of FIG. 1 can best be understood in conjunction with FIGS. 2 and 3. FIG. 2 shows a simplified digital electronic circuit made up of logic gates and designated circuit nodes, and may be, for example, circuitry within the digital circuit 52 of the UUT 30. FIG. 3 shows a flow chart of a diagnostic decision tree program to facilitate troubleshooting the circuit of FIG. 2. This diagnostic program, together with the correct signatures, test patterns, instructions for both processors, subroutines, and any other necessary information, may be prerecorded and stored on tape. Generally, it would be convenient for the manufacturer of the UUT to furnish the prerecorded however, programs may be written and recorded by the user as well.

The diagnostic system is connected to the UUT as described hereinabove, leaving the data probe 56 unconnected, and the switches of the front panel control unit 18 set to positions apropriate to establishing a desired operating mode. The cassette or cartridge is inserted into the magnetic tape unit and the MPU 10 begins to execute the diagnostic program of FIG. 3. First, the correct signatures and test points are read from the tape and stored in RAM 12. Each signature suitably may be a four-character hexidecimal character set representing a 16-bit digital word in the conventional manner. After the transfer of data from the tape to RAM 12, a message is written on the screen of display device 20 telling the user to connect the data probe to node O. When the data probe 56 is connected to node O, the user presses a seuence button on either the data probe or the front panel control unit 18 to inform the system that the connection has been made. The MPU 10 notifies the in-circuit emulation module 52 and signature generator 22 that a signature should be generated. The in-circuit emulation module 52 causes a predetermined bit pattern to be generated and applied to the digital circuits 42. In synchronism therewith, start, stop, and clock signals are generated and sent to the signature generator 22 at the appropriate times. The data received at node O is applied via data probe 56 to the signature generator, where it is compressed into a signature of the type mentioned hereinabove. The MPU 10 compares the test signature with the correct signature stored in RAM 12. The comparison may be executed by a subroutine stored in ROM 14. Both the correct and test signatures may be displayed on the display device to provide the user with a visual indication of what signature to expect and what is actually being generated. If the signatures match, a message is printed on the screen stating that the system is operating correctly and that the test is completed. If the signatures do not match, a fault is indicated and the user is directed to connect the data probe to node M. See FIG. 3. The above-described procedure is repeated to generate a test signature at node M, compare it to a correct signature, and made a branching decision in accordance with the validity of the signature. Thus, both the correct and tested signatures are displayed, and the user is directed to connect the data probe to either node N or node I, depending whether the signature is correct or incorrect. The testing, decisions, and branching will occur until the faulty gate or input is located. A perusal of the flow diagram shows that the user is led directly to the fault, substantially reducing the troubleshooting time. Further, a highly trained or skilled technician is not required to test the UUT.

While there has been shown and described the preferred embodiment according to the present invention, it will be apparent to those skilled in the art that many changes and modifications may be made without departing from the invention in its broader aspects. It is therefore contemplated that the appended claims will not be construed in a limiting sense and will cover any such modifications or embodiments as fall within the true scope of the invention.

What we claim as being novel is:

1. An apparatus for diagnosing faults in a unit under test containing digital electronic circuits, comprising:
   a signature generator connectable to preselected locations in said digital electronic circuits for receiving digital signals in the form of predetermined bit patterns generated by said unit under test, said signature generator comprising a feedback shift register which generates cyclic redundancy check character test signatures in accordance with said predetermined bit patterns and synchronous start, stop, and clock signals provided by said unit under test;
   means for storing predetermined correct signatures associated with selected locations in said unit under test; and
   means for electronically comparing said test signatures with said predetermined signatures in a predetermined manner under program control.

2. An apparatus in accordance with claim 1 wherein said comparison means includes a micoprocessing unit, memory means, and a bus interconnecting said microprocessing unit, memory means, and signature generator.

3. An apparatus in accordance with claim 2 further including display means coupled to said bus for displaying said predetermined signatures and said test signatures.

4. An apparatus in accordance with claim 2 further including program input means coupled to said bus for inputting predetermined diagnostic programs for troubleshooting said unit under test in a predetermined manner.

5. An apparatus in accordance with claim 2 further including in-circuit emulation means coupled to said bus and being connectable to said unit under test for exercising said unit under test by emulating signal generating and control portions thereof, said in-circuit emulation means further generating said synchronous start, stop, and clock signals and providing such signals directly to said signature generator.

6. An apparatus in accordance with claim 2 further including input means for inputting predetermined signature data and diagnostic decision tree information related to said unit under test, and indication means indicating in a predetermined sequence said selected locations for connecting said signature generator.

* * * * *

UNITED STATES PATENT AND TRADEMARK OFFICE
CERTIFICATE OF CORRECTION

PATENT NO. : 4,192,451

DATED : March 11, 1980

INVENTOR(S) : Stephen Swerling et al

It is certified that error appears in the above-identified patent and that said Letters Patent are hereby corrected as shown below:

Column 3, Line 58, "check" should be --clock--

Column 4, Line 57, "apropriate" should be --appropriate--

Column 5, Line 1, "seuence" should be --sequence--

Column 5, Line 26, "made" should be --make--

Signed and Sealed this

Twenty-second Day of July 1980

[SEAL]

Attest:

SIDNEY A. DIAMOND

Attesting Officer

Commissioner of Patents and Trademarks